(12) United States Patent
Arana et al.

(10) Patent No.: US 7,592,697 B2
(45) Date of Patent: Sep. 22, 2009

(54) MICROELECTRONIC PACKAGE AND METHOD OF COOLING SAME

(75) Inventors: Leonel R. Arana, Phoenix, AZ (US); Michael W. Newman, Chandler, AZ (US); Je-Young Chang, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 58 days.

(21) Appl. No.: 11/845,159

(22) Filed: Aug. 27, 2007

(65) Prior Publication Data

US 2009/0057881 A1 Mar. 5, 2009

(51) Int. Cl.
*H01L 23/34* (2006.01)

(52) U.S. Cl. .................. 257/714; 257/712; 257/713; 257/715; 257/E23.085; 257/E23.097

(58) Field of Classification Search .................. 257/625, 257/675, 706–707, 712–722, 796, E23.051, 257/E23.08–113, E31.131, E33.075
See application file for complete search history.

(56) References Cited

U.S. PATENT DOCUMENTS 6,278,181 B1 * 8/2001 Maley ........................ 257/712

| | | | | |
|---|---|---|---|---|
| 2006/0002088 A1 * | 1/2006 | Bezama et al. | ............... | 361/702 |
| 2006/0060963 A1 * | 3/2006 | Chang | ........................ | 257/706 |
| 2007/0004190 A1 * | 1/2007 | Dambrauskas et al. | ...... | 438/613 |
| 2007/0063337 A1 * | 3/2007 | Schubert et al. | ............. | 257/714 |
| 2007/0090517 A1 * | 4/2007 | Moon et al. | .................. | 257/706 |
| 2007/0126103 A1 * | 6/2007 | Shi | ............................ | 257/686 |
| 2007/0177352 A1 * | 8/2007 | Monfarad et al. | ........... | 361/699 |
| 2008/0272484 A1 * | 11/2008 | Myers et al. | ................. | 257/714 |

* cited by examiner

*Primary Examiner*—Monica Lewis
*Assistant Examiner*—Marvin Payen
(74) *Attorney, Agent, or Firm*—Kenneth A. Nelson on behlaf of Intel Corporation

(57) ABSTRACT

A microelectronic package comprises a chip stack (110) that includes a substrate (111), a first die (112) over the substrate and a second die (113) over the first die, a first underfill layer (114) between the substrate and the first die, and a second underfill layer (115) between the first die and the second die. The microelectronic package further comprises a fluidic microchannel system (120) in the chip stack, and the fluidic microchannel system comprises a fluid inlet (121) and a fluid outlet (122) connected to each other by a fluidic passage (123).

7 Claims, 3 Drawing Sheets

MICROELECTRONIC PACKAGE AND METHOD OF COOLING SAME

FIELD OF THE INVENTION

The disclosed embodiments of the invention relate generally to microelectronic packages, and relate more particularly to thermal management in stacked-die microelectronic packages.

BACKGROUND OF THE INVENTION

Single-die flip-chip devices are readily cooled using heat sinks, often in combination with integrated heat spreaders (IHS), fans, heat pipes, and, in extreme cases, liquid heat exchangers. Stacked-die devices, including 3D through-silicon-via (TSV) assemblies, are more difficult to cool. While the top die in the 3D stack may be placed in intimate thermal contact with a heat spreader, heat sink, or heat pipe, the interposed die (the die sandwiched between substrate and the top die) does not have a low resistance thermal path along which to dissipate heat. Poor heat rejection from the interposed die places severe design constraints on next-generation 3D TSV stacked-die architectures, as it basically dictates that high-power die (e.g., CPU) must be placed on top of the stack. To optimize performance of 3D TSV CPU products, flexibility to design the CPU die as the interposed die is strongly desired and for this, a thermal solution for adequately cooling a high-power interposed die in a 3D TSV stacking arrangement is needed.

BRIEF DESCRIPTION OF THE DRAWINGS

The disclosed embodiments will be better understood from a reading of the following detailed description, taken in conjunction with the accompanying figures in the drawings in which.

Figure 1:
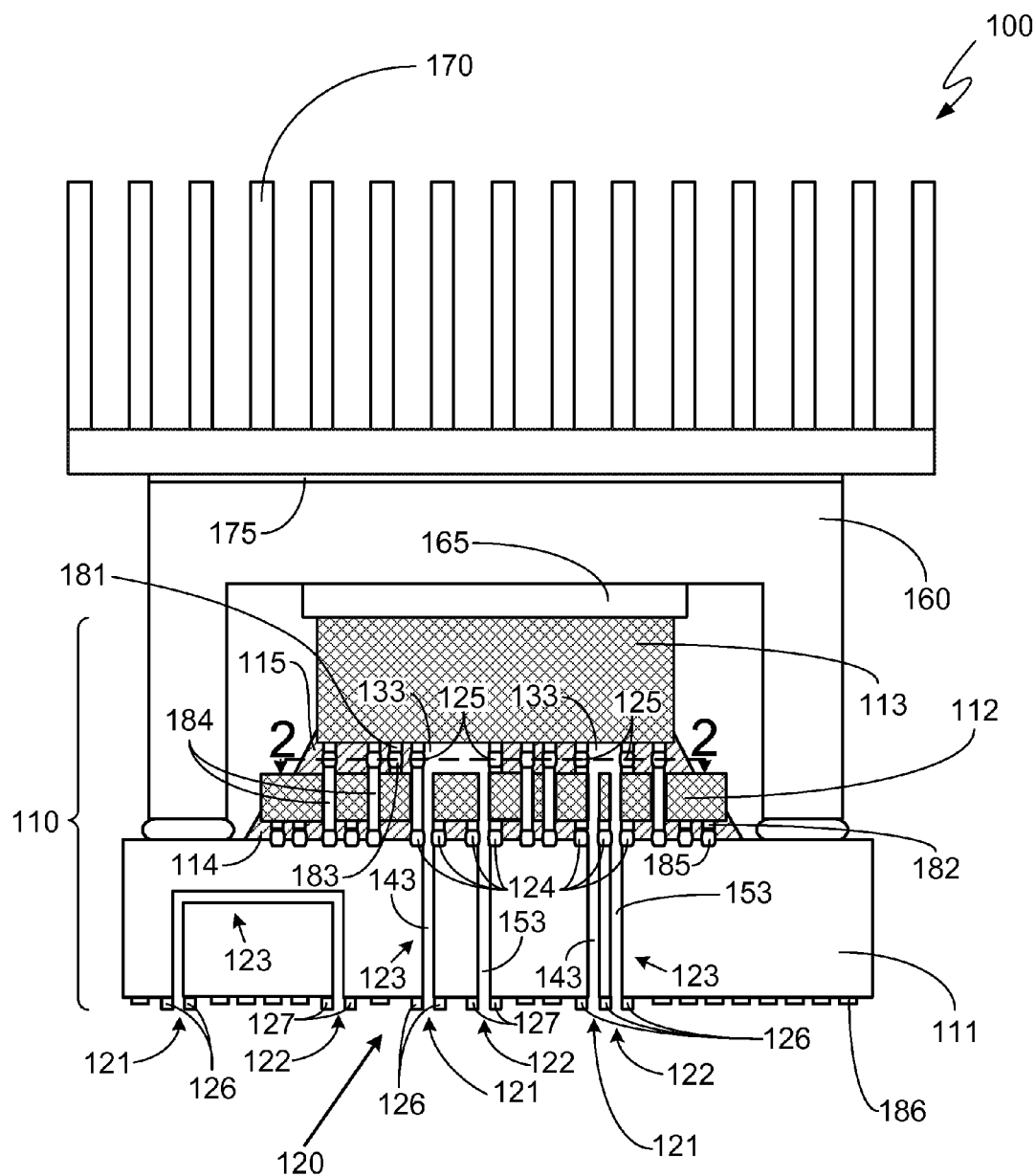
FIG. 1 is a cross-sectional view of a microelectronic package according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner. Objects described herein as being "adjacent to" each other may be in physical contact with each other, in close proximity to each other, or in the same general region or area as each other, as appropriate for the context in which the phrase is used. Occurrences of the phrase "in one embodiment" herein do not necessarily all refer to the same embodiment.

DETAILED DESCRIPTION OF THE DRAWINGS

In one embodiment of the invention, a microelectronic package comprises a chip stack that includes a substrate, a first die over the substrate and a second die over the first die, a first underfill layer between the substrate and the first die, and a second underfill layer between the first die and the second die. The microelectronic package further comprises a fluidic microchannel system in the chip stack, and the fluidic microchannel system comprises a fluid inlet and a fluid outlet connected to each other by a fluidic passage.

As discussed in greater detail below, embodiments of the invention deliver liquid coolant directly to the high-power interposed die in a 3D TSV stack. Unfilled through-silicon vias in the interposed die may be used as microchannels for liquid cooling. The liquid coolant comes into direct contact with the interposed die to offer excellent cooling. The through-die fluidic vias of embodiments of the invention can be strategically placed close to the hotspots in the die to maximize heat rejection. Embodiments of the invention may be particularly effective in rejecting heat from the interposed die in the 3D arrangement, as the interposed die is often unable to make intimate thermal contact with an integrated heat spreader (IHS), heat sink, or other thermal management device.

Referring now to the drawings, FIG. 1 is a cross-sectional view of a microelectronic package 100 according to an embodiment of the invention. As illustrated in FIG. 1, microelectronic package 100 comprises a chip stack 110 that includes a substrate 111 (organic or ceramic), a die 112 over substrate 111 and a die 113 over die 112, an underfill layer 114 (or other strengthening layer or other interface) between substrate 111 and die 112, and an underfill layer 115 (or other strengthening layer or other interface) between die 112 and die 113. Through-silicon vias 184 carry electrical signals between various parts of microelectronic package 100. As an example, one or more of through-silicon vias 184 may be through-silicon-vias (TSVs) or other vias as known in the art.

In a non-illustrated embodiment, microelectronic package 100 could include more than two stacked dies.

Microelectronic package 100 further comprises additional components, as will now be discussed. Metal bumps or pads 181 on die 113 (e.g., copper pillars) are for electrical interconnection to die 112. Metal bumps or pads 182 on die 112 are for electrical connection to substrate 111. Solder 183 connects pads 181 to pads 182. Through-silicon vias 184 contain an electrical conductor, e.g., a copper via. Through-silicon vias 184 carry electrical signals between various parts of microelectronic package 100. Solder 185 connects pads 182 to substrate 111. Lands 186 on substrate 111 provide electrical connection sites that may be used, for example, to connect microelectronic package 100 to a motherboard (not shown) or other system component.

Microelectronic package 100 still further comprises a fluidic microchannel system 120 in chip stack 110. Fluidic microchannel system 120 comprises a fluid inlet 121 and a fluid outlet 122 connected to each other by a fluidic passage 123. (Of course, any one or more of the openings identified as fluid inlets could instead be fluid outlets, and vice versa.) FIG. 1 illustrates three such fluidic microchannel systems 120, each of which will be described in more detail below and each of which is exemplary of one or more fluidic microchannel systems that may form a part of microelectronic package 100 or another microelectronic package according to an embodiment of the invention. It should be understood that various embodiments may include any number of fluidic microchannel systems, any of which may be similar to one of the three fluidic microchannel systems 120 illustrated in FIG. 1 or to other, non-illustrated fluidic microchannel systems according to embodiments of the invention.

In one embodiment, fluidic passage 123 is only in substrate 111. FIG. 1 illustrates one fluidic microchannel system 120 of this type, toward the left-hand side of the figure. In a different embodiment, fluidic passage 123 extends through substrate 111, underfill layer 114, and die 112 and into underfill layer 115. FIG. 1 illustrates two fluidic microchannel systems 120 of this type, both of them near the middle of the figure. In a non-illustrated embodiment, fluidic passage 123 could extend through substrate 111, underfill layer 114, die 112, and underfill layer 115 and into die 113. In at least one embodiment, fluidic microchannel system 120 is located adjacent to one or more hot spots of die 112 and/or die 113.

In one embodiment where fluidic passage 123 extends, as described, through substrate 111, underfill layer 114, and die 112 and into underfill layer 115, fluidic passage 123 comprises a fluidic channel 133 in underfill layer 115 and a fluidic via 143 and a fluidic via 153 fluidly connected to fluidic channel 133. As shown, fluid inlet 121 is an opening of fluidic via 143 (and is a place where fluid may enter fluidic via 143) and fluid outlet 122 is an opening of fluidic via 153 (and is a place where fluid may exit fluidic via 153).

In the same or another embodiment, fluidic microchannel system 120 further comprises a gasket 124 in underfill layer 114 and a gasket 125 in underfill layer 115. Fluidic microchannel system 120 may further comprise a gasket 126 around fluid inlet 121 and a gasket 127 around fluid outlet 122. Gaskets 124, 125, 126, and 127 may help seal fluid in fluidic microchannel system 120 so as to prevent leaks. Lands 186 and gaskets 126 and 127 may also provide connection sites to which a socket or other interface (not shown) may be attached for the purpose of connecting microelectronic package 100 to a package cooling system (also not shown) or the like. The fluidic lines may be connected to non-illustrated system fluidic cooling solution components such as a pump, a heat exchanger, or the like, that enable the relatively cooled fluid to be pumped back to microelectronic package 100.

In one embodiment, one or more of gaskets 124, 125, 126, and 127 are made of a solder material that has been formed or patterned into an annulus such that it contains a hole through which fluid may flow. In another embodiment, one or more of gaskets 124, 125, 126, and 127 are made of an elastomer material or another material that compresses when pressure is applied to it, such as when a flip chip procedure is performed. As an example, the elastomer material may be an o-ring, an elastomer sheet or pad (in which holes are punched in appropriate locations), or the like. In another embodiment, one or more of gaskets 124, 125, 126, and 127 are made of a curable material, again formed or patterned with a central hole through which fluid may flow, that hardens after it cures. In another embodiment, one or more of gaskets 124, 125, 126, and 127 are formed by placing a non-wettable material between substrate 111 and die 112 and/or between die 112 and die 113 before the placement in those locations of underfill material 114 and underfill material 115. When underfill material 114 and/or underfill material 115 are applied, the underfill material flows around the non-wettable material, forming a void.

Referring still to FIG. 1, microelectronic package 100 may further comprise an integrated heat spreader 160, possibly having integrated microchannels (not shown) over die 113 and a thermal interface material 165 between die 113 and integrated heat spreader 160. Microelectronic package 100 may still further comprise a heatsink 170 over integrated heat spreader 160 and a thermal interface material 175 between integrated heat spreader 160 and heatsink 170.

A flow path for coolant in fluidic microchannel systems 120 according to one embodiment of the invention is from the system, through the non-illustrated socket (or non-illustrated dedicated fluidic interconnect that bypasses a socket), through substrate 111, through gasket 126, through die 112 (and possibly additional, non-illustrated, interposed die), along fluidic channel 133, back through the one or more interposer die (including die 112), through gasket 127, through substrate 111, and back to the system.

Figure 2:
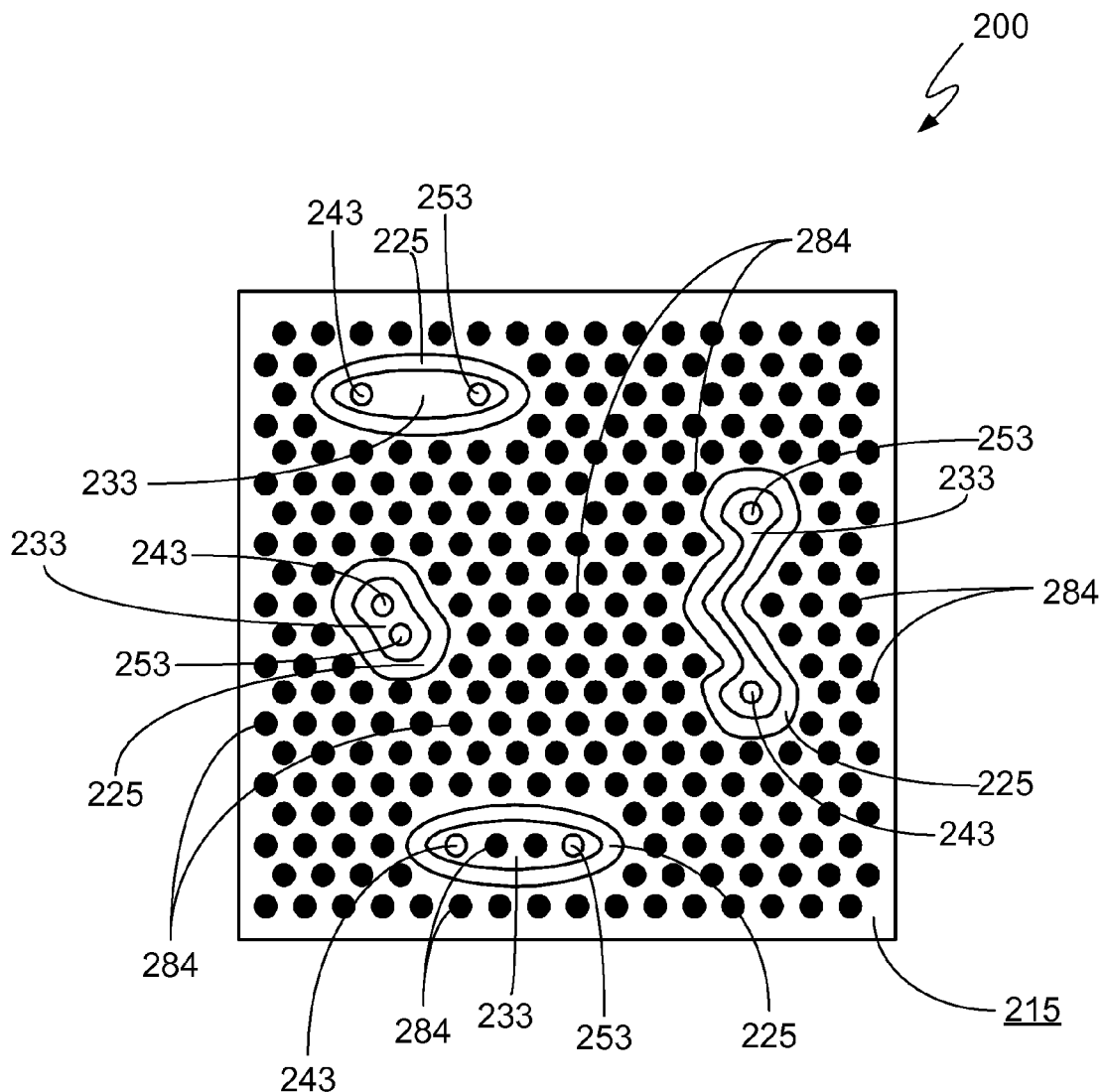
FIG. 2 is a cross-sectional view of a portion of a different microelectronic package according to an embodiment of the invention.

FIG. 2 is a cross-sectional view of a portion of a microelectronic package 200 according to an embodiment of the invention. The depicted portion is similar to what may be seen from a perspective of a line 2-2 in FIG. 1 looking from underfill layer 115 toward die 112, although certain details shown in FIG. 2 differ from those shown (from a different perspective) in FIG. 1.

As illustrated in FIG. 2, microelectronic package 200 comprises a plurality of electrical connections 284 within an underfill layer 215. Underfill layer 215 also contains fluidic channels 233 and fluidic vias 243 and 253 surrounded by gaskets 225. As an example, electrical connections 284, underfill layer 215, fluidic channels 233, fluidic vias 243 and 253, and gaskets 225 can be similar to, respectively, through-silicon vias 184, underfill layer 115, fluidic channels 133, fluidic vias 143 and 153, and gaskets 125, all of which are shown in FIG. 1. Together, a fluidic channel 233, a fluidic via 243, a fluidic via 253, and a gasket 225 make up a fluidic microchannel system such as fluidic microchannel systems 120 that are shown in FIG. 1. As illustrated in FIG. 2, these fluidic microchannel systems may be made larger or smaller, symmetrical or asymmetrical, vertically oriented, horizontally oriented, diagonally oriented, or otherwise, as desired. As an example, such design choices may be made having the location and size of die hot spots in mind such that the fluidic microchannel systems may be located adjacent to such hot spots for maximum or enhanced cooling effect.

Figure 3:
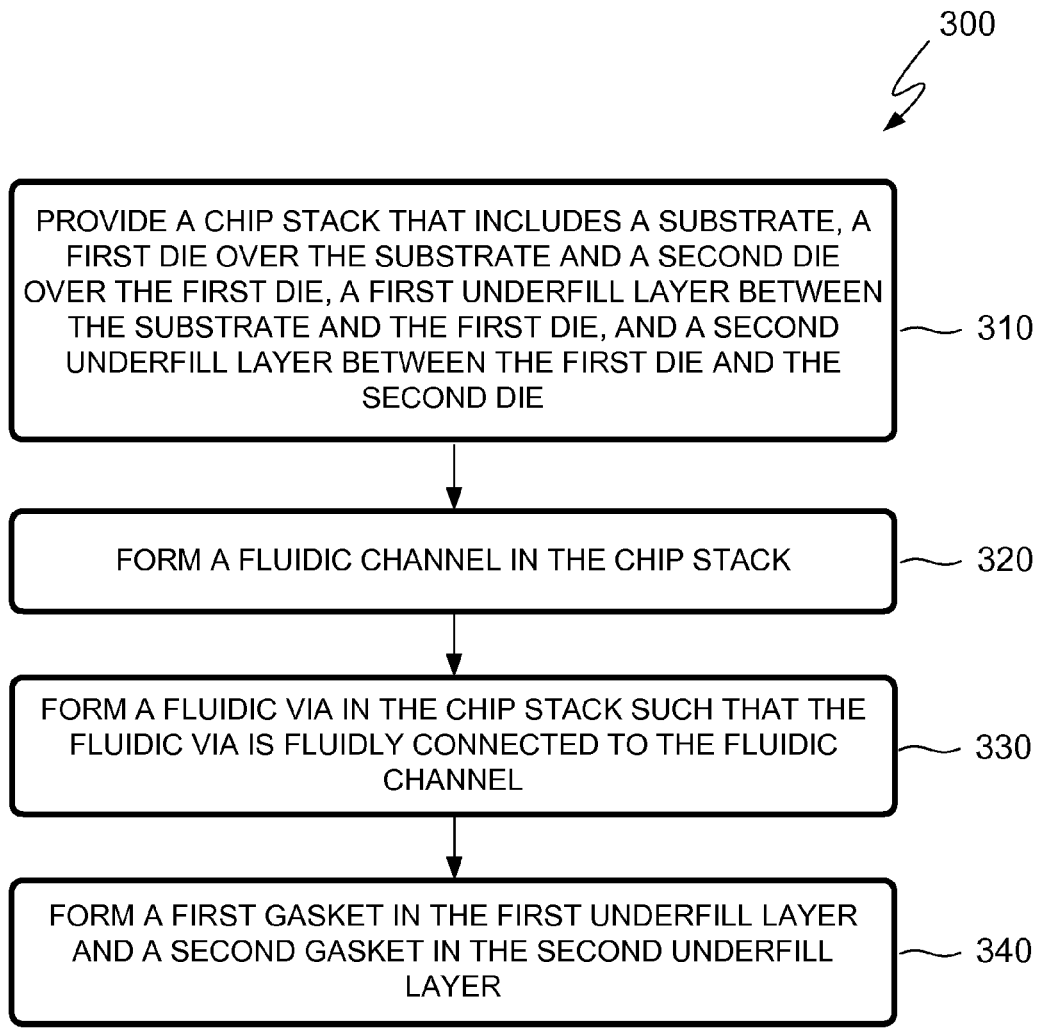
FIG. 3 is a flowchart illustrating a method of cooling a stacked-die microelectronic package according to an embodiment of the invention.

FIG. 3 is a flowchart illustrating a method 300 of cooling a stacked-die microelectronic package according to an embodiment of the invention. A step 310 of method 300 is to provide a chip stack that includes a substrate, a first die over the substrate and a second die over the first die, a first underfill layer between the substrate and the first die, and a second underfill layer between the first die and the second die. As an example, the chip stack can be similar to chip stack 110, shown in FIG. 1, and the substrate, the first die, the second die, the first underfill layer, and the second underfill layer can be similar to, respectively, substrate 111, die 112, die 113, underfill layer 114, and underfill layer 115, all of which are also shown in FIG. 1.

A step 320 of method 300 is to form a fluidic channel in the chip stack. As an example, the fluidic channel can be similar to fluidic channel 133 that is shown in FIG. 1. In one embodiment, step 320 comprises forming the fluidic channel in the second underfill layer.

A step 330 of method 300 is to form a fluidic via in the chip stack such that the fluidic via is fluidly connected to the fluidic channel. As an example, the fluidic via can be similar to one or both of fluidic vias 143 and 153, both of which are shown in FIG. 1. In one embodiment, step 330 comprises forming the fluidic via in the substrate, in the first underfill layer, and in the first die. In the same or another embodiment, step 330 further comprises forming the fluidic via adjacent to a hot spot in the first or the second die. As an example, the fluidic via may be formed using plasma etching (in which trenches are made in the silicon or other material using an inductively coupled plasma etcher), laser drilling or another drilling operation, wet etching, or the like. As an example, the fluidic vias may be drilled or otherwise formed either before or after assembly of chip stack 110.

A step 340 of method 300 is to form a first gasket in the first underfill layer and a second gasket in the second underfill layer. Alternatively, the first gasket and the second gasket may be formed in separate steps rather than in a single step. As an example, the first gasket and the second gasket can be similar to, respectively, gasket 124 and gasket 125, both of which are shown in FIG. 1.

In one embodiment, forming the first gasket comprises patterning a first level interconnect material, such as solder, into an annulus. In the same or another embodiment, forming the second gasket comprises patterning the second underfill layer such that it includes an annulus. In a different embodiment, forming the first gasket comprises placing a first elastomer gasket between the substrate and the first die, and forming the second gasket comprises placing a second elastomer gasket between the first die and the second die.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the microelectronic package and related cooling methods discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A microelectronic package comprising:
a chip stack that includes:
  a substrate;
  a first die over the substrate and a second die over the first die;
  a first underfill layer between the substrate and the first die; and
  a second underfill layer between the first die and the second die;
a first fluidic microchannel system in the chip stack, the first fluidic microchannel system comprising a first fluid inlet and a first fluid outlet connected to each other by a first fluidic passage; and
a second fluidic microchannel system in the chip stack, the second fluidic microchannel system comprising a second fluid inlet and a second fluid outlet connected to each other by a second fluidic passage, wherein the first fluidic passage is entirely contained within the substrate and the first fluid inlet and the first fluid outlet are both located at a first side of the substrate, and wherein the second fluidic passage extends through the substrate, the first underfill layer, and the first die and into the second underfill layer.

2. The microelectronic package of claim 1 wherein:
the second fluidic passage comprises:
a fluidic channel in the second underfill layer, and
a first fluidic via and a second fluidic via fluidly connected to the fluidic channel; and
the fluidic microchannel system further comprises a first gasket in the first underfill layer and a second gasket in the second underfihl layer.

3. The microelectronic package of claim 2 further comprising:
an integrated heat spreader over the second die; and
a first thermal interface material between the second die and the integrated heat spreader.

4. The microelectronic package of claim 3 further comprising:
a heatsink over the integrated heat spreader; and
a second thermal interface material between the integrated heat spreader and the heatsink.

5. The microelectronic package of claim 1 wherein:
the first fluid inlet is surrounded by a first gasket and the first fluid outlet is surrounded by a second gasket.

6. The microelectronic package of claim 5 wherein:
at least one of the first gasket and the second gasket is made of one of a solder material, an elastomer material, and a curable material.

7. The microelectronic package of claim 6 wherein:
the first die comprises a hot spot; and
at least one of the first fluidic microchannel system and the second fluidic microchannel system is located adjacent to the hot spot.

* * * * *